United States Patent
Hao et al.

(10) Patent No.: US 12,364,094 B2
(45) Date of Patent: Jul. 15, 2025

(54) ORGANIC LIGHT EMITTING DIODE, MANUFACTURING METHOD THEREOF, DISPLAY SUBSTRATE AND DISPLAY APPARATUS

(71) Applicant: BOE Technology Group Co., Ltd., Beijing (CN)

(72) Inventors: Yanjun Hao, Beijing (CN); Caiyu Qu, Beijing (CN); Guanyin Wen, Beijing (CN); Songquan Wu, Beijing (CN); Pengfei Zuo, Beijing (CN); Xiaobo Du, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 337 days.

(21) Appl. No.: 17/801,623

(22) PCT Filed: Oct. 28, 2021

(86) PCT No.: PCT/CN2021/126892
§ 371 (c)(1),
(2) Date: Aug. 23, 2022

(87) PCT Pub. No.: WO2022/179152
PCT Pub. Date: Sep. 1, 2022

(65) Prior Publication Data
US 2023/0354636 A1    Nov. 2, 2023

(30) Foreign Application Priority Data
Feb. 26, 2021   (CN) .................. 202110222496.7

(51) Int. Cl.
*H10K 50/18* (2023.01)
*H10K 59/35* (2023.01)
(Continued)

(52) U.S. Cl.
CPC .......... *H10K 50/181* (2023.02); *H10K 59/35* (2023.02); *H10K 71/16* (2023.02); *H10K 71/60* (2023.02)

(58) Field of Classification Search
None
See application file for complete search history.

(56) References Cited

FOREIGN PATENT DOCUMENTS

| CN | 104934542 A | 9/2015 |
| CN | 105576146 A | 5/2016 |

(Continued)

OTHER PUBLICATIONS

First Office Action with Search Report issued on Dec. 28, 2021 for application No. CN202110222496.7 with English translation attached.
(Continued)

*Primary Examiner* — Anthony Ho
(74) *Attorney, Agent, or Firm* — Nath, Goldberg & Meyer; Joshua B. Goldberg (57) ABSTRACT

An organic light emitting diode, a manufacturing method thereof, a display substrate and a display apparatus are disclosed. The organic light emitting diode includes: a first electrode and a second electrode opposite to each other; and a first hole transport layer, a first electron blocking layer, a blue emission layer, at least one first hole blocking layer, and a first electron transport layer, which are between the first electrode and the second electrode and sequentially arranged in a direction approaching the second electrode, wherein a total thickness of all the at least one first hole blocking layer is greater than a thickness of the first electron blocking layer.

17 Claims, 6 Drawing Sheets

(51) Int. Cl.
*H10K 71/16* (2023.01)
*H10K 71/60* (2023.01)

(56) References Cited

FOREIGN PATENT DOCUMENTS

| | | |
|---|---|---|
| CN | 107017346 A | 8/2017 |
| CN | 209104191 U | 7/2019 |
| CN | 110459688 A | 11/2019 |
| CN | 111969119 A | 11/2020 |
| CN | 112136363 A | 12/2020 |
| CN | 112952013 A | 6/2021 |
| KR | 20150041360 A | 4/2015 |
| KR | 20210015258 A | 2/2021 |

OTHER PUBLICATIONS

Decision of Rejection issued on Sep. 7, 2022 for application No. CN202110222496.7 with English translation attached.

ORGANIC LIGHT EMITTING DIODE, MANUFACTURING METHOD THEREOF, DISPLAY SUBSTRATE AND DISPLAY APPARATUS

This is a National Phase Application filed under 35 U.S.C. 371 as a national stage of PCT/CN2021/126892, filed Oct. 28, 2021, an application claiming the benefit of Chinese Application No. 202110222496.7, filed Feb. 26, 2021, the content of each of which is hereby incorporated by reference in its entirety.

TECHNICAL FIELD

The present disclosure relates to the technical field of display, and particularly to an organic light emitting diode, a manufacturing method thereof, a display substrate and a display apparatus.

BACKGROUND

With the development of organic light emitting diode (OLED) display technology, an OLED display apparatus is widely used. In the OLED display apparatus, each pixel includes a red light emitting diode, a blue light emitting diode, and a green light emitting diode.

A current display apparatus is prone to color shift when displaying a low gray scale image.

SUMMARY

The present disclosure is directed to at least one of the technical problems in the prior art, and provides an organic light emitting diode, a manufacturing method thereof, a display substrate and a display apparatus.

In order to achieve the above object, the present disclosure provides an organic light emitting diode, including:
  a first electrode and a second electrode opposite to each other; and
  a first hole transport layer, a first electron blocking layer, a blue emission layer, at least one first hole blocking layer, and a first electron transport layer, which are between the first electrode and the second electrode and sequentially arranged in a direction approaching the second electrode, wherein a total thickness of all the at least one first hole blocking layer is greater than a thickness of the first electron blocking layer.

In some embodiments, the at least one first hole blocking layer includes a plurality of first hole blocking layers, which are made of a same material.

In some embodiments, the at least one first hole blocking layer includes a plurality of first hole blocking layers, which are made of different materials; and electron mobilities of the plurality of first hole blocking layers are increased layer by layer in a direction approaching the first electron transport layer.

In some embodiments, the plurality of first hole blocking layers include two first hole blocking layers, wherein an electron mobility of one of the two first hole blocking layers is in a range of $1.5 \times 10^{-6}$ cm$^2$/Vs to $2.5 \times 10^{-6}$ cm$^2$/Vs, and an electron mobility of the other of the two first hole blocking layers is in a range of $7.0 \times 10^{-6}$ cm$^2$/Vs to $8.0 \times 10^{-6}$ cm$^2$/Vs.

In some embodiments, a material of the at least one first hole blocking layer includes a planar aromatic compound having a large conjugated structure.

In some embodiments, the total thickness of all the at least one first hole blocking layer is 1.5 or more times the thickness of the first electron blocking layer.

In some embodiments, a thickness of each of the at least one first hole blocking layer is in a range of 2 nm to 10 nm.

An embodiment of the present disclosure further provides a display substrate, including:
  a base substrate; and
  a plurality of organic light emitting diodes on the base substrate, wherein the plurality of organic light emitting diodes include at least one blue organic light emitting diode employing the above-described organic light emitting diode.

In some embodiments, the plurality of organic light emitting diodes further includes a red organic light emitting diode and a green organic light emitting diode,
  the red organic light emitting diode includes:
  a third electrode and a fourth electrode opposite to each other; and
  a second hole transport layer, a second electron blocking layer, a red emission layer, a second hole blocking layer, and a second electron transport layer, which are between the third electrode and the fourth electrode and sequentially arranged in a direction approaching the fourth electrode,
  the green organic light emitting diode includes:
  a fifth electrode and a sixth electrode opposite to each other;
  a third hole transport layer, a third electron blocking layer, a green emission layer, a third hole blocking layer, and a third electron transport layer, which are between the fifth electrode and the sixth electrode and sequentially arranged in a direction approaching the sixth electrode,
  wherein the third electrode, the fifth electrode and the first electrode are in a same layer; the fourth electrode, the sixth electrode and the second electrode are in a same layer; the second hole transport layer, the third hole transport layer and the first hole transport layer are in a same layer; the second electron transport layer, the third electron transport layer and the first electron transport layer are in a same layer; and the second hole blocking layer and the third hole blocking layer each are in a same layer with the at least one first hole blocking layer in a one-to-one correspondence.

In some embodiments, a thickness of the green emission layer is greater than a thickness of the blue emission layer and less than a thickness of the red emission layer.

In some embodiments, a thickness of the third electron blocking layer is greater than a thickness of the first electron blocking layer and less than a thickness of the second electron blocking layer.

In some embodiments, the first electrode is between the blue emission layer and the base substrate, and the second electrode is on a side of the blue emission layer away from the base substrate.

An embodiment of the present disclosure further provides a display apparatus, which includes the above described display substrate.

An embodiment of the present disclosure further provides a method for manufacturing an organic light emitting diode, including:
  forming a first electrode;
  forming a first hole transport layer, a first electron blocking layer, a blue emission layer, at least one first hole blocking layer, and a first electron transport layer, respectively, wherein the first hole transport layer, the first electron blocking layer, the first emission layer, the at least one first hole blocking layer, and the first electron transport layer are arranged in a direction leaving the first electrode; and a total thickness of all the at least one first hole blocking layer is greater than a thickness of the first electron blocking layer; and forming a second electrode, wherein the second electrode is opposite to the first electrode.

In some embodiments, each of the at least one first hole blocking layer is formed by an evaporation process.

BRIEF DESCRIPTION OF DRAWINGS

The accompanying drawings, which are included to provide a further understanding of the present disclosure and constitute a part of this specification, serve to explain the present disclosure together with the following specific embodiments, but do not constitute a limitation to the present disclosure. In the drawings.

DETAIL DESCRIPTION OF EMBODIMENTS

In order to make the objects, technical solutions and advantages of the embodiments of the present disclosure more apparent, the technical solutions of the embodiments of the present disclosure will be clearly and completely described with reference to the accompanying drawings of the embodiments of the present disclosure. Obviously, the described embodiments are only some of the embodiments of the present disclosure, not all of the embodiments. All other embodiments, which may be obtained by one of ordinary skill in the art without any creative effort based on the embodiments in the present disclosure, fall within the protection scope of the present disclosure.

The terminology used herein to describe embodiments of the present disclosure is not intended to limit and/or define the scope of the present disclosure. For example, unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Unless the context clearly indicates otherwise, the singular form "a", "an", "the", or the like used herein does not denote a limitation of quantity, but rather denotes the presence of at least one element. The term "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

In the following description, when an element or layer is referred to as being "on" or "connected to" another element or layer, the element or layer may be directly on the another element or layer, directly connected to the another element or layer, or intervening elements or layers may be present therebetween. However, when an element or layer is referred to as being "directly on" or "directly connected to" another element or layer, there are no intervening elements or layers present therebetween. The term "and/or" includes any and all combinations of one or more of the associated listed items.

Figure 1:
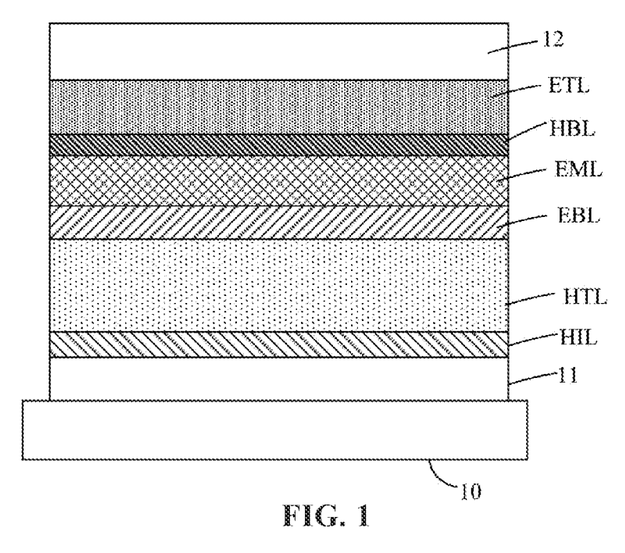
FIG. 1 is a schematic diagram illustrating a structure of a light emitting diode in a comparative example.

In an OLED display apparatus, each pixel unit includes a red light emitting diode, a green light emitting diode, and a blue light emitting diode. FIG. 1 is a schematic diagram illustrating a structure of a light emitting diode in a comparative example. As shown in FIG. 1, the light emitting diode includes a first electrode 11, a hole injection layer HIL, a hole transport layer HTL, an electron blocking layer EBL, an emission layer EML, a hole blocking layer HBL, an electron transport layer ETL, an electron injection layer EIL, and a second electrode 12, which are sequentially disposed in a direction leaving a base substrate 10. After a voltage is applied between the first electrode 11 and the second electrode 12, holes (indicated by hollow circles in FIG. 5) and electrons (indicated by solid circles in FIG. 5) are injected from the first electrode 11 and the second electrode 12, respectively, and enter a HOMO (highest occupied molecular orbital) level of the hole transport layer HTL and a LUMO (lowest unoccupied molecular orbital) level of the electron transport layer ETL, respectively, and then transition to the emission layer EML and meet to form electron-hole pairs, i.e., excitons. The excitons in excited states of the molecule are released in a form of photons, emitting visible light. A thickness of the electron blocking layer EBL is great in the organic light emitting diode with a long emission wavelength; and a thickness of the electron blocking layer EBL is low in the organic light emitting diode with a short emission wavelength. A thickness of the hole blocking layer HBL is less than or equal to the thickness of the electron blocking layer EBL. For example, in a blue organic light emitting diode, the thickness of the hole blocking layer HBL is the same as the thickness of the electron blocking layer EBL, and in red and green organic light emitting diodes, the thickness of the hole blocking layer HBL is less than the thickness of the electron blocking layer EBL.

Figure 2:
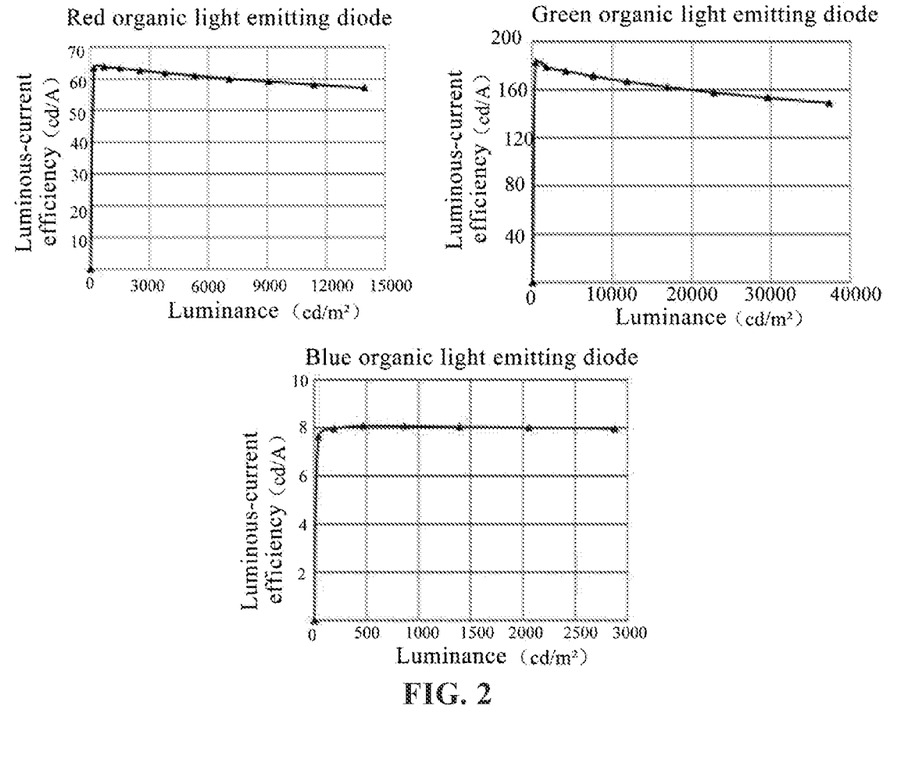
FIG. 2 is a graph showing variations of luminous-current efficiency with luminance for different organic light emitting diodes.
Figure 3A:
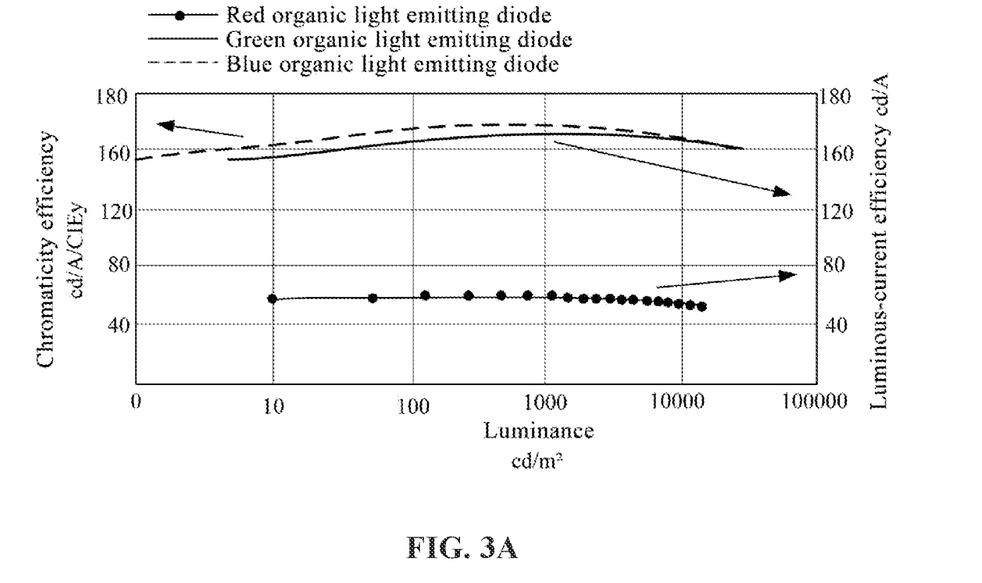
FIG. 3A is a graph showing variations of chromaticity efficiency with luminance for organic light emitting diodes of various colors in an ideal case.
Figure 3B:
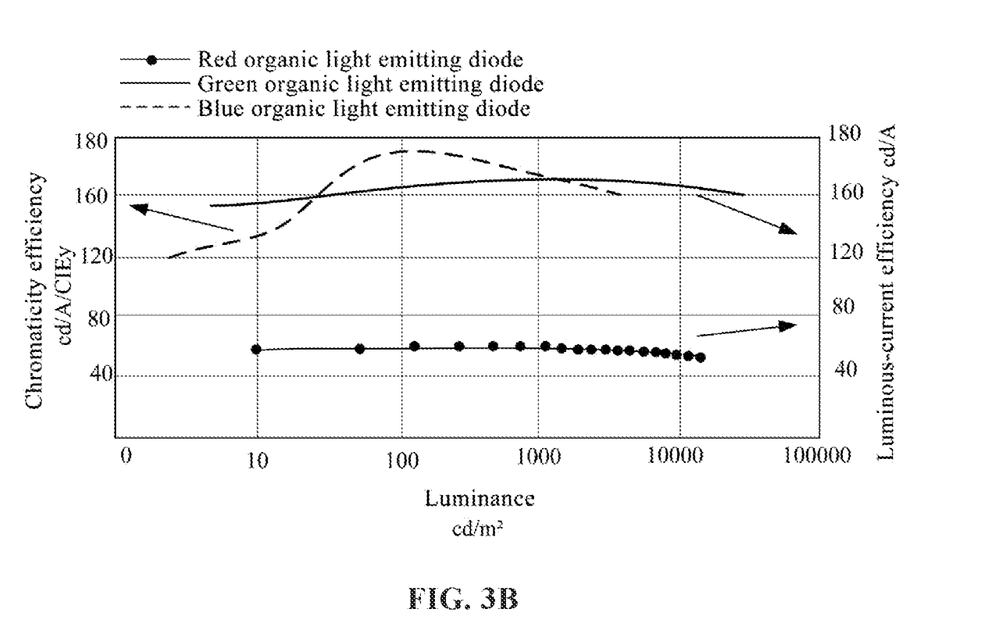
FIG. 3B is a graph illustrating variations of chromaticity efficiency with luminance for organic light emitting diodes of various colors in an actual case.

In general, in the red organic light emitting diode and the green organic light emitting diode, the emission layer EML is made of a phosphorescent material; in the blue organic light emitting diode, the emission layer EML is made of a fluorescent material, and relationships of efficiency with luminance for the fluorescent material and the efficiency with luminance for the phosphorescent material are not consistent. FIG. 2 is a graph showing variations of luminous-current efficiency with luminance for different organic light emitting diodes. As shown in FIG. 2, the luminous efficiency of the red organic light emitting diode or the green organic light emitting diode reaches maximum quickly when the red organic light emitting diode or the green organic light emitting diode displays at a low luminance. With increase of the luminance, a roll-off phenomenon is conspicuous in the efficiency of the red organic light emitting diode or the green organic light emitting diode. However, before the luminous-current efficiency of the blue organic light emitting diode reaches maximum, there is a significant "climbing" phenomenon, that is, when the blue organic light emitting diode is used to realize a display with a low luminance, the luminous-current efficiency is low. FIG. 3A is a graph showing variations of efficiency with luminance for organic light emitting diodes of various colors in an ideal case, and FIG. 3B is a graph illustrating variations of efficiency with luminance for organic light emitting diodes of various colors in an actual case. A relation curve of efficiency with luminance for the blue organic light emitting diode in FIGS. 3A and 3B is a curve of variation of chromaticity efficiency with luminance, wherein the chromaticity efficiency is a ratio of luminous-current efficiency (in cd/A) to an emission color (i.e., y value in the CIE color coordinates). A relation curve of efficiency with luminance for the red organic light emitting diode or green organic light emitting diode in FIGS. 3A and 3B is a curve of variation of luminous-current efficiency with luminance. As can be seen from FIGS. 2 to 3B, since the luminous-current efficiency of the blue organic light emitting diode is low when the luminance is low, proportions in the white light are prone to be imbalanced when the display apparatus displays a low gray scale image, resulting in color shift.

The inventor found that the reason why there is a significant "climbing" in the luminous-current efficiency of the blue organic light emitting diode is that: at a low current density, a large number of holes are accumulated at an interface between the electron blocking layer EBL and the emission layer EML, and when electrons are injected into the emission layer EML, a large number of excitons are generated at the interface between the electron blocking layer EBL and the emission layer EML, resulting in quenching of exciton concentration and weakening of exciton transition luminescence, thereby resulting in low luminous-current efficiency of the organic light emitting diode. When the current density increases, holes are injected into the emission layer EML, and excitons are more uniformly dispersed throughout the emission layer EML, so that quenching is reduced and exciton transition luminescence is increased.

Figure 4A:
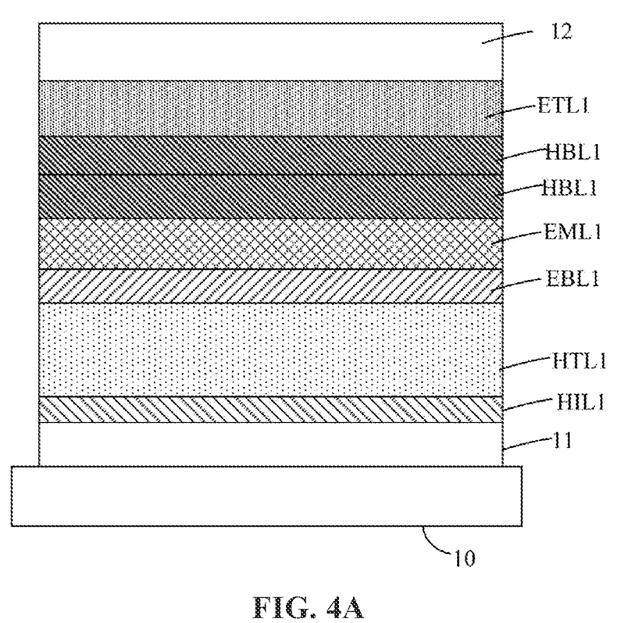
FIG. 4A is a schematic diagram illustrating a structure of a light emitting diode provided in some embodiments of the present disclosure.
Figure 4B:
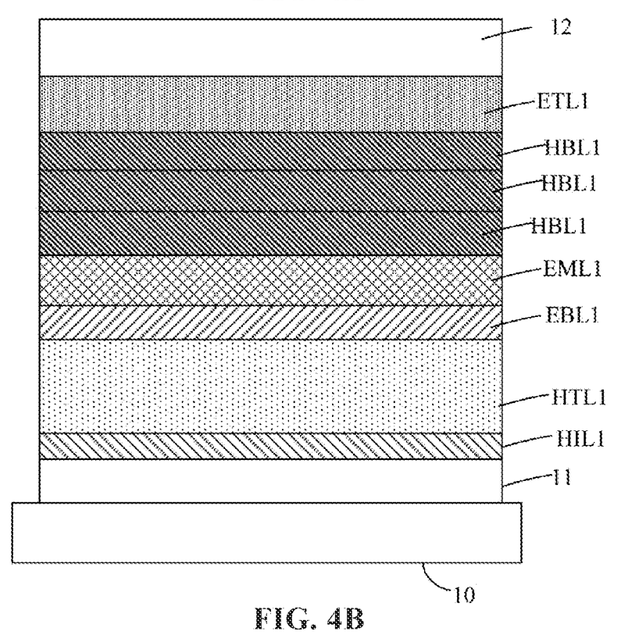
FIG. 4B is a schematic diagram illustrating a structure of a light emitting diode provided in other embodiments of the present disclosure.

FIG. 4A is a schematic diagram illustrating a structure of a light emitting diode provided in some embodiments of the present disclosure, and FIG. 4B is a schematic diagram illustrating a structure of a light emitting diode provided in other embodiments of the present disclosure, wherein the light emitting diode is a blue light emitting diode. As shown in FIGS. 4A and 4B, the organic light emitting diode includes: a first electrode 11 and a second electrode 12 arranged opposite to each other. The first electrode 11 is an anode and may be made of a transparent conductive material such as Indium Tin Oxide (ITO). Alternatively, the first electrode 11 may be a composite layer of multiple layers of conductive materials. For example, the first electrode 11 includes a composite layer of ITO/Ag/ITO, wherein a thickness of the ITO layer is, for example, 8 nm, and a thickness of the Ag layer is, for example, 10 nm. The second electrode 12 is a cathode, and may be made of a metal material with high reflectivity, such as Al or Ag. A thickness of the second electrode 12 is, for example, in a range of 10 nm to 20 nm, for example, 16 nm.

The organic light emitting diode further includes a first hole transport layer HTL1, a first electron blocking layer EBL1, a blue emission layer EML1, at least one first hole blocking layer HBL1 and a first electron transport layer ETL1, which are between the first electrode 11 and the second electrode 12 and sequentially arranged in a direction approaching the second electrode 12. The blue emission layer EML1 is made of a fluorescent material. The number of the first hole blocking layers HBL1 in FIGS. 4A and 4B is merely an example, and alternatively may be set to other numbers, for example, one, four, or the like. It should be understood that when a plurality of first hole blocking layers HBL1 are provided, the plurality of first hole blocking layers HBL1 are all located between the blue emission layer EML1 and the first electron transport layer ETL1. In some embodiments, the organic light emitting diode further includes a first hole injection layer HILL which is located between the first hole transport layer HTL1 and the first electrode 11.

In some embodiments, a total thickness of all the first hole blocking layers HBL1 is greater than a thickness of the first electron blocking layer EBL1. For example, where one first hole blocking layer HBL1 is provided, the thickness of the first hole blocking layer HBL1 is greater than the thickness of the first electron blocking layer EBL1. Where a plurality of first hole blocking layers HBL1 are alternatively provided, the total thickness of the plurality of first hole blocking layers HBL1 is greater than the thickness of the first electron blocking layer EBL1.

In some embodiments, the total thickness of all the first hole blocking layers HBL1 is greater than 5 nm.

Figure 5:
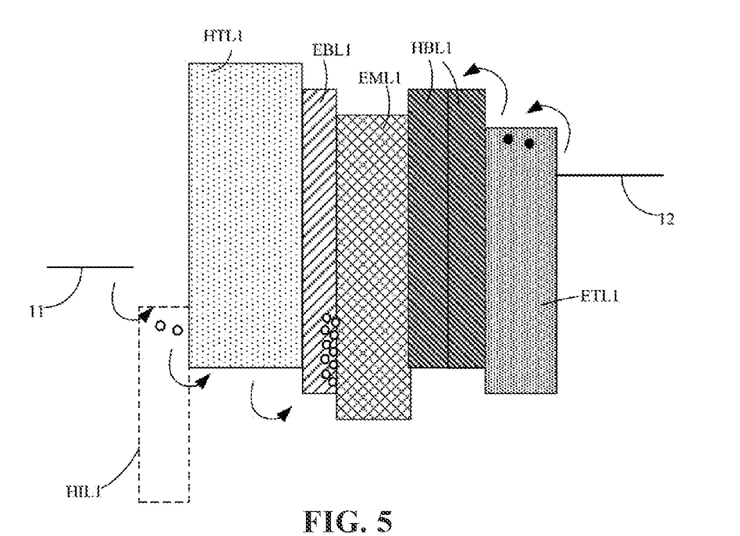
FIG. 5 is a schematic diagram illustrating energy levels of an organic light emitting diode provided in some embodiments of the present disclosure.

FIG. 5 is a schematic diagram illustrating energy levels of an organic light emitting diode provided in some embodiments of the present disclosure. As shown in FIG. 5, after a voltage is applied between the first electrode 11 and the second electrode 12, holes and electrons are injected from the first electrode 11 and the second electrode 12, respectively, and enter a HOMO level of the first hole transport layer HTL1 and a LUMO level of the first electron transport layer ETL1, respectively, and then transition to the blue emission layer EML1. When a current density is low, a large number of holes are accumulated at the interface between the electron blocking layer EBL and the emission layer EML. In the present disclosure, the total thickness of the first hole blocking layer HBL1 between the blue emission layer EML1 and the first electron transport layer ETL1 is great, so that a migration path of electrons from the first electron transport layer ETL1 to the blue emission layer EML1 may be increased, thereby reducing a concentration of electrons injected to the interface between the first electron blocking layer EBL1 and the blue emission layer EML1 at a low gray scale, thereby improving the problem of low luminous efficiency caused by quenching of excitons between the first electron blocking layer EBL1 and the blue emission layer EML1 at a low gray scale, preventing color shift of the display apparatus during displaying at a low gray scale, and improving the display quality.

In some embodiments, a material of the first hole blocking layer HBL1 includes a planar aromatic compound having a large conjugated structure. For example, the material of the first hole blocking layer HBL1 may be a polyaryl-substituted pyridine derivative, a 1,10-phenanthroline derivative, or the like, and may be a mixture of one or more materials.

In some embodiments, the total thickness of the first hole blocking layers HBL1 is more than 1.5 times the thickness of the first electron blocking layer EBL1, for example, 2 to 5 times the thickness of the first electron blocking layer EBL1.

In some embodiments, a plurality of first hole blocking layers HBL1 are provided, and different first hole blocking layers HBL1 may have a same thickness or different thicknesses. Alternatively, a thickness of each first hole blocking layer HBL1 is in a range of 2 nm to 10 nm. For example, each first hole blocking layer HBL1 has a thickness of 5 nm.

In some examples, a plurality of first hole blocking layers HBL1 are provided, and the plurality of first hole blocking layers HBL1 are made of a same material.

For example, two first hole blocking layer HBL1 are provided, and the two first hole blocking layers HBL1 are made of a same material having an electron mobility of $2.1 \times 10^{-6}$ cm$^2$/Vs, HOMO=6.22 eV, and LUMO=2.65 eV.

In other examples, a plurality of first hole blocking layer HBL1 are provided, and different first hole blocking layers HBL1 are made of different materials. Electron mobilities of the first hole blocking layers HBL1 are gradually increased in a direction approaching the first electron transport layer ETL1, which is beneficial to injecting electrons into the blue emission layer EML1, so that when performing high-luminance display, a reduction of the light emitting efficiency caused by a long transition distance of electrons is prevented, thereby ensuring the display effect of the display apparatus at high luminance.

For example, two first hole blocking layers HBL1 are provided, the electron mobility of the first hole blocking layer HBL1 away from the first electron transport layer ETL1 is in a range of $1.5 \times 10^{-6}$ cm$^2$/Vs to $2.5 \times 10^{-6}$ cm$^2$/Vs, and the electron mobility of the first hole blocking layer HBL1 close to the first electron transport layer ETL1 is in a range of $7.0 \times 10^{-6}$ cm$^2$/Vs to $8.0 \times 10^{-6}$ cm$^2$/Vs. For example, the electron mobility of the first hole blocking layer HBL1 away from the first electron transport layer ETL1 is $2.1 \times 10^{-6}$ cm$^2$/Vs, and the electron mobility of the first hole blocking layer HBL1 close to the first electron transport layer ETL1 is $7.64 \times 10^{-6}$ cm$^2$/Vs.

Figure 6:
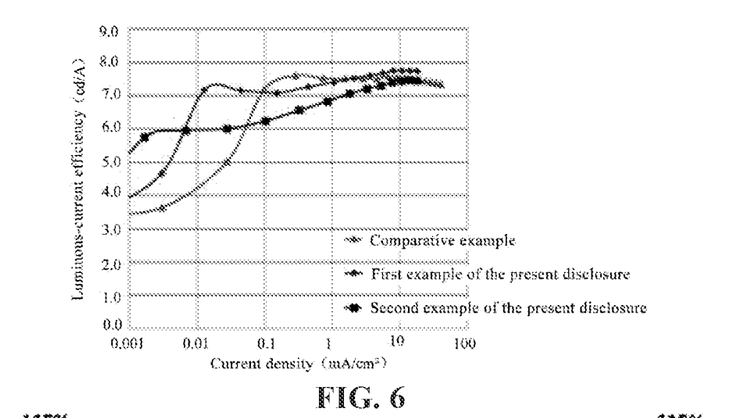
FIG. 6 is a graph showing luminous efficiencies of organic light emitting diode in two examples of the present disclosure and an organic light emitting diode in a comparative example.

FIG. 6 is a graph showing luminous efficiencies of organic light emitting diodes in two examples of the present disclosure and an organic light emitting diode in a comparative example, and each curve is a curve illustrating variation of luminous efficiency of the organic light emitting diode with current density. The organic light emitting diode in the comparative example is the organic light emitting diode in FIG. 1, wherein the hole blocking layer has a thickness of 5 nm, a mobility $\mu_c=2.1 \times 10^{-6}$ cm$^2$/Vs, HOMO=6.22 eV, and LUMO=2.65 eV. The organic light emitting diode in a first example of the present disclosure employs the structure in FIG. 4A, in which two first hole blocking layers HBL1 are provided, and a thickness of each hole blocking layer HBL1 is 5 nm. The organic light emitting diode in a second example of the present disclosure employs the structure in FIG. 4B, in which three first hole blocking layers HBL1 are provided, and a thickness of each first hole blocking layer HBL1 is 5 nm. In addition, in both examples of the present disclosure, a material of each first hole blocking layer HBL1 of the organic light emitting diode is the same as that of the hole blocking layer HBL of the organic light emitting diode in FIG. 1, and the materials and thicknesses of other layers are the same as those of corresponding layers in the organic light emitting diode in FIG. 1. "Climbing" ratios of the organic light emitting diodes in the two examples of the present disclosure and the organic light emitting diodes in the comparative example are shown in table 1. The "climbing" ratio is expressed as a ratio of the luminous-current efficiency of the light emitting diode at a current density of 0.01 mA/cm$^2$ to the luminous-current efficiency of the light emitting diode at a current density of 1 mA/cm$^2$.

TABLE 1

| Structure | Comparative example | First example of the present disclosure | Second example of the present disclosure |
|---|---|---|---|
| "Climbing" ratio | 0.54 | 0.87 | 0.84 |

As can be seen from FIG. 6 and table 1, the organic light emitting diode of the comparative example has low luminous-current efficiency at a low current density (less than 0.01 mA/cm$^2$), and the luminous-current efficiency remarkably "climbs" with increase of the current density. Specifically, the "climbing" ratio of the organic light emitting diode in the comparative example is about 0.5, and it is predicted that the blue organic light emitting diode of the display apparatus employing this structure has a low efficiency at a low gray scale, and is prone to defects such as color shift and image quality loss. The organic light emitting diodes in the first example and the second example of the present disclosure each have a great luminous-current efficiency at a low current density, and the luminous-current efficiency "climbs" insignificantly with the increase of the current density. The "climbing" ratios of the organic light emitting diodes in both examples each are above 0.8. It is predicted that the display apparatus employing the structure in the first example or the second example is less prone to defects such as color shift and image quality loss at a low gray scale.

Figure 7:
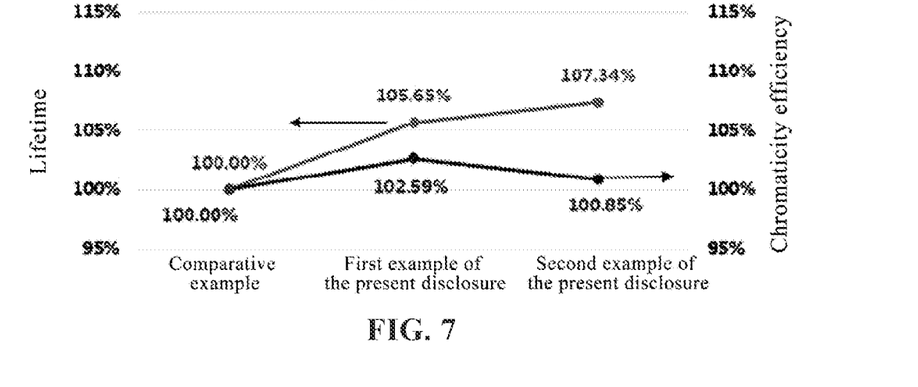
FIG. 7 is a graph showing a comparison between organic light emitting diodes in two examples of the present disclosure and an organic light emitting diode in a comparative example in terms of lifetime and chromaticity efficiency.

FIG. 7 is a graph showing a comparison between organic light emitting diodes in two examples of the present disclosure and an organic light emitting diode in a comparative example in terms of lifetime and chromaticity efficiency, wherein the lifetime and the chromaticity efficiency of each light emitting diode in FIG. 7 are lifetime and chromaticity efficiency at a current density of 15 mA/cm$^2$, respectively. As can be seen from FIG. 7, the organic light emitting diodes in the first example and the second example of the present disclosure have improved lifetime, and the chromaticity efficiency is not affected.

Figure 8:
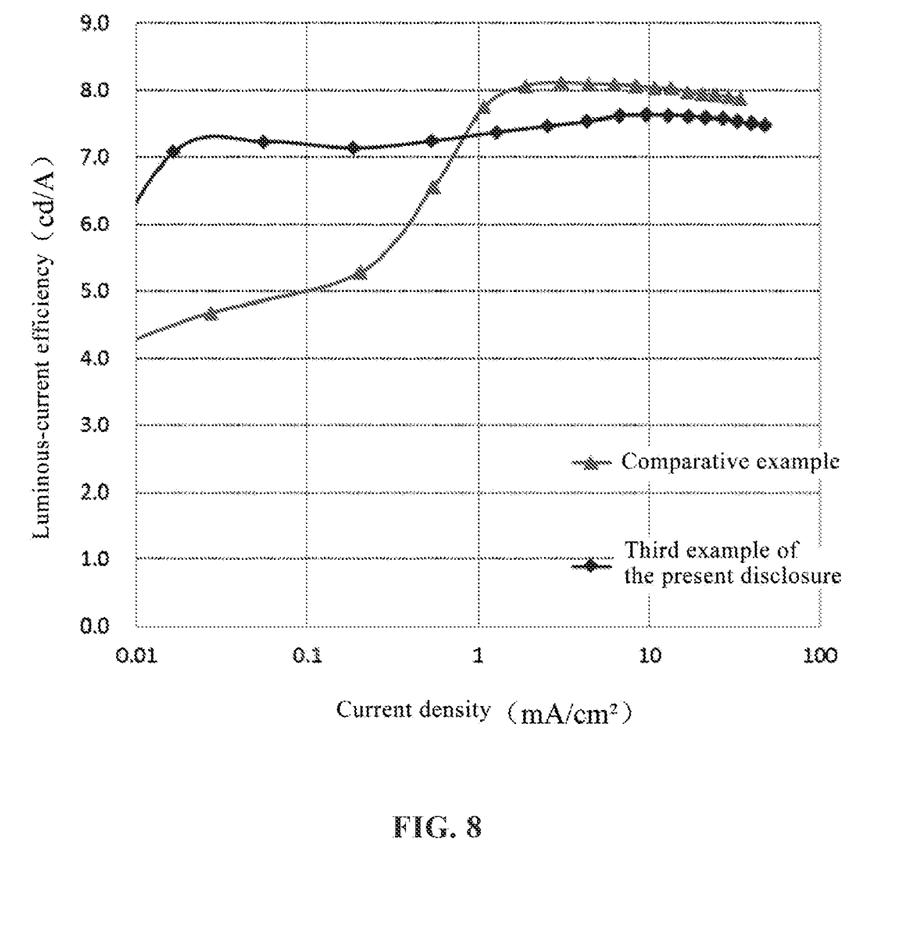
FIG. 8 is a graph showing luminous efficiencies of an organic light emitting diode in a third example of the present disclosure and an organic light emitting diode in a comparative example.

FIG. 8 is a graph showing luminous efficiencies of an organic light emitting diode in a third example of the present disclosure and an organic light emitting diode in a comparative example, and each curve is a curve illustrating variation of luminous efficiency of the organic light emitting diode with current density. The organic light emitting diode in the comparative example is the organic light emitting diode in FIG. 1, in which the hole blocking layer HBL has a thickness of 5 nm, an electron mobility of $2.1 \times 10^{-6}$ cm$^2$/Vs, HOMO=6.22 eV, and LUMO=2.65 eV. The organic light emitting diode in a third example of the present disclosure employs the structure in FIG. 4A, in which two first hole blocking layers HBL1 are provided, a thickness of each first hole blocking layer HBL1 is 5 nm, the first hole transport layer HTL1 away from the first electron transport layer ETL1 has an electron mobility of $2.1\times10^{-6}$ cm$^2$/Vs, HOMO=6.22 eV, and LUMO=2.65 eV; and the first hole transport layer HTL1 close to the first electron transport layer ETL1 has an electron mobility of $7.64\times10^{-6}$ cm$^2$/Vs, HOMO=6.13 eV, and LUMO=2.78 eV. The materials and thicknesses of other layers in the third example is the same as those of corresponding layers in the comparative example.

The "climbing" ratios of the organic light emitting diode in the third example of the present disclosure and the organic light emitting diode in the comparative example are shown in table 2.

TABLE 2

| Structure | Comparative example | Third example of the present disclosure |
|---|---|---|
| "Climbing" ratio | 0.55 | 0.96 |

As can be seen from FIG. 8 and table 2, compared with the comparative example, the organic light emitting diode in the third example of the present disclosure has a great luminous-current efficiency at a low current density, the luminous-current efficiency "climbs" insignificantly with increase of the current density, and the "climbs" ratio is 0.96. It can be seen that the display apparatus employing the organic light emitting diode in the third example of the present disclosure is less prone to defects such as color shift and image quality loss at a low gray scale.

Figure 9:
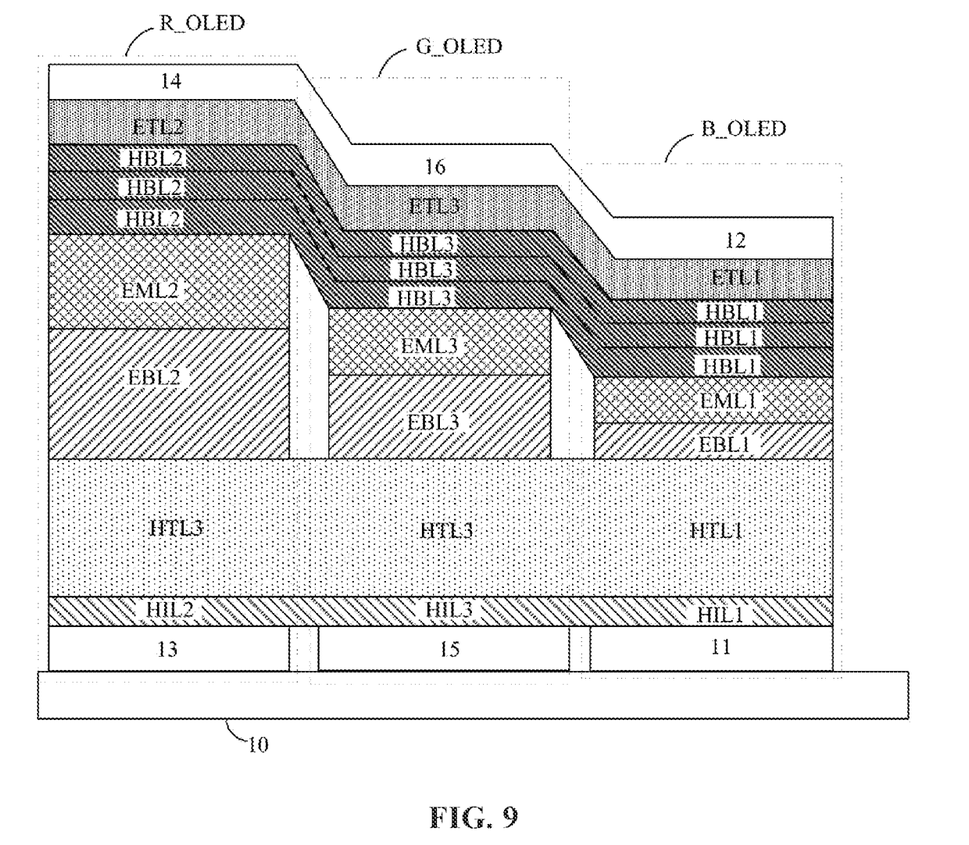
FIG. 9 is a schematic diagram of a display substrate provided in some embodiments of the present disclosure.

FIG. 9 is a schematic diagram of a display substrate provided in some embodiments of the present disclosure. As shown in FIG. 9, the display substrate includes a base substrate 10 and a plurality of organic light emitting diodes disposed on the base substrate 10, wherein at least one of the plurality of organic light emitting diodes is a blue organic light emitting diode B_OLED, which employs the organic light emitting diode in the above embodiment. In some embodiments, the first electrode 11 is located between the blue emission layer EML1 and the base substrate 10, and the second electrode 12 is located on a side of the blue emission layer EML1 away from the base substrate 10.

As shown in FIG. 9, the plurality of organic light emitting diodes further includes at least one red organic light emitting diode R_OLED and at least one green organic light emitting diode G_OLED.

In some embodiments, the red organic light emitting diode R_OLED includes a third electrode 13 and a fourth electrode 14 that are arranged opposite to each other, and further includes a second hole injection layer HIL2, a second hole transport layer HTL2, a second electron blocking layer EBL2, a red emission layer EML2, at least one second hole blocking layer HBL2, and a second electron transport layer ETL2, which are located between the third electrode 13 and the fourth electrode 14 and sequentially arranged in a direction approaching the fourth electrode 14.

The green organic light emitting diode G_OLED includes a fifth electrode 15 and a sixth electrode 16 that are arranged opposite to each other, and a third hole injection layer HIL3, a third hole transport layer HTL3, a third electron blocking layer EBL3, a green emission layer EML3, at least one third hole blocking layer HBL3, and a third electron transport layer ETL3, which are located between the fifth electrode 15 and the sixth electrode 16 and are sequentially arranged in a direction approaching the sixth electrode 16.

The third electrode 13, the fifth electrode 15 and the first electrode 11 are disposed in a same layer. "In a same layer" means that in order to simplify the manufacturing process, a plurality of structures are formed from a same material layer through a patterning process, and thus these structures are in a same layer in terms of a stacking relationship, which does not mean distances between these structures and the base substrate 10 must be the same.

Further, the fourth electrode 14, the sixth electrode 16, and the second electrode 12 are disposed in a same layer. For example, the fourth electrode 14, the sixth electrode 16, and the second electrode 12 are formed to have a one-piece structure. The second hole transport layer HTL2, the third hole transport layer HTL3, and the first hole transport layer HTL1 are disposed in the same layer. For example, the second hole transport layer HTL2, the third hole transport layer HTL3, and the first hole transport layer HTL1 are formed to have a one-piece structure. The second electron transport layer ETL2, the third electron transport layer ETL3 and the first electron transport layer ETL1 are disposed in the same layer. For example, the second electron transport layer ETL2, the third electron transport layer ETL3 and the first electron transport layer ETL1 are formed to have a one-piece structure. The second hole blocking layers HBL2 and the third hole blocking layers HBL3 each are disposed in a same layer as first hole blocking layers HBL1 in a one-to-one correspondence. For example, each of the second hole blocking layers HBL2 and each of the third hole blocking layers HBL3 is formed to have a one-piece structure with the corresponding first hole blocking layer HBL1.

As shown in FIG. 9, a thickness of the red emission layer EML2 is greater than a thickness of the green emission layer EML3, and a thickness of the green emission layer EML3 is greater than a thickness of the blue emission layer EML1. For example, the thickness of the red emission layer EML2 is in a range of 40 nm to 50 nm, for example, 45 nm; the thickness of the green emission layer EML3 is in a range of 30 nm to 40 nm, for example, 35 nm; and the thickness of the blue emission layer EML1 is in a range of 15 nm to 25 nm, for example, 25 nm.

In some embodiments, a thickness of the third electron blocking layer EBL3 is greater than a thickness of the first electron blocking layer EBL1 and less than a thickness of the second electron blocking layer EBL2. For example, the thickness of the first electron blocking layer EBL1 is in a range of 2 nm to 10 nm, for example, 5 nm; the thickness of the second electron blocking layer EBL2 is in a range of 70 nm to 80 nm, for example, 76 nm; and the thickness of the third electron blocking layer EBL3 is in a range of 40 nm to 50 nm, for example, 47 nm.

Figure 10:
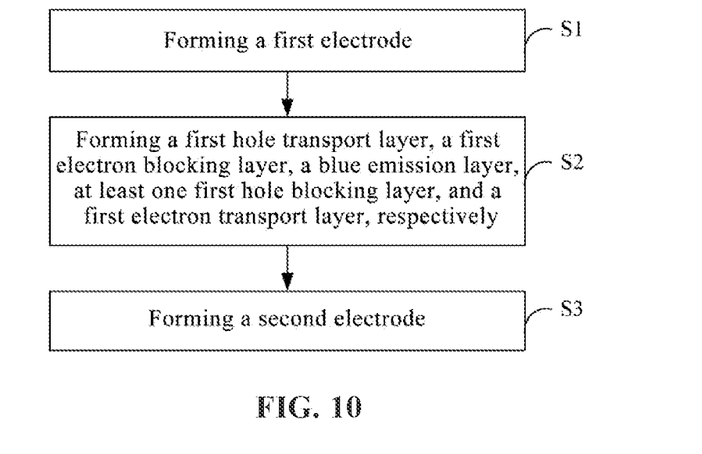
FIG. 10 is a flowchart of a method for manufacturing an organic light emitting diode provided in some embodiments of the present disclosure.

FIG. 10 is a flowchart of a method for manufacturing an organic light emitting diode provided in some embodiments of the present disclosure. As shown in FIG. 10, the method includes:

Step S1, forming a first electrode.

Step S2, forming a first hole transport layer, a first electron blocking layer, a blue emission layer, at least one first hole blocking layer, and a first electron transport layer, respectively, wherein the first hole transport layer, the first electron blocking layer, the first emission layer, the first hole blocking layer, and the first electron transport layer are arranged in a direction leaving the first electrode; and a total thickness of all the first hole blocking layers is greater than a thickness of the first electron blocking layer.

In some embodiments, the first hole transport layer, the first electron blocking layer, the blue emission layer, the at least one first hole blocking layer, and the first electron transport layer may be formed through an evaporation process.

Step S3, forming a second electrode, wherein the second electrode is arranged opposite to the first electrode.

The sequence of steps S1 to S3 is not particularly limited. For example, the first electrode may be formed firstly, and then the first hole transport layer, the first electron blocking layer, the blue emission layer, at least one first hole blocking layer, and the first electron transport layer may be sequentially formed; and then the second electrode is formed. Alternatively, the second electrode may be formed firstly, and then the first electron transport layer, the at least one first hole blocking layer, the blue emission layer, the first electron blocking layer, and the first hole transport layer are sequentially formed; and then the first electrode is formed.

In some embodiments, a step of forming a first hole injection layer may be further included, wherein the first hole injection layer is located between the first electrode and the first hole transport layer.

An embodiment of the present disclosure further provide a display apparatus, which includes the display substrate and an encapsulation layer for encapsulating the organic light emitting diodes.

The display apparatus may be any product or component with a display function, such as an electronic paper, an OLED panel, a mobile phone, a tablet computer, a television, a monitor, a notebook computer, a digital photo frame, a navigator or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications also fall within the protection scope of the present disclosure.

What is claimed is:

1. An organic light emitting diode, comprising:
a first electrode and a second electrode opposite to each other; and
a first hole transport layer, a first electron blocking layer, a blue emission layer, at least one first hole blocking layer, and a first electron transport layer, which are between the first electrode and the second electrode and sequentially arranged in a direction approaching the second electrode, wherein a total thickness of all the at least one first hole blocking layer is greater than a thickness of the first electron blocking layer,
wherein a material of the at least one first hole blocking layer comprises a planar aromatic compound having a large conjugated structure.

2. The organic light emitting diode according to claim 1, wherein the at least one first hole blocking layer comprises a plurality of first hole blocking layers, which are made of a same material.

3. The organic light emitting diode according to claim 1, wherein the at least one first hole blocking layer comprises a plurality of first hole blocking layers, which are made of different materials; and
electron mobilities of the plurality of first hole blocking layers are increased layer by layer in a direction approaching the first electron transport layer.

4. The organic light emitting diode according to claim 3, wherein the plurality of first hole blocking layers comprise two first hole blocking layers, wherein an electron mobility of one of the two first hole blocking layers is in a range of $1.5 \times 10^{-6}$ cm$^2$/Vs to $2.5 \times 10^{-6}$ cm$^2$/Vs, and an electron mobility of the other of the two first hole blocking layers is in a range of $7.0 \times 10^{-6}$ cm$^2$/Vs to $8.0 \times 10^{-6}$ cm$^2$/Vs.

5. The organic light emitting diode according to claim 1, wherein the total thickness of all the at least one first hole blocking layer is 1.5 or more times the thickness of the first electron blocking layer.

6. The organic light emitting diode according to claim 1, wherein a thickness of each of the at least one first hole blocking layer is in a range of 2 nm to 10 nm.

7. A display substrate, comprising:
a base substrate; and
a plurality of organic light emitting diodes on the base substrate, wherein the plurality of organic light emitting diodes comprise at least one blue organic light emitting diode which is the organic light emitting diode according to claim 1.

8. The display substrate according to claim 7, wherein the plurality of organic light emitting diodes further comprises a red organic light emitting diode and a green organic light emitting diode,
the red organic light emitting diode comprises:
a third electrode and a fourth electrode opposite to each other; and
a second hole transport layer, a second electron blocking layer, a red emission layer, a second hole blocking layer, and a second electron transport layer, which are between the third electrode and the fourth electrode and sequentially arranged in a direction approaching the fourth electrode,
the green organic light emitting diode comprises:
a fifth electrode and a sixth electrode opposite to each other; and
a third hole transport layer, a third electron blocking layer, a green emission layer, a third hole blocking layer, and a third electron transport layer, which are between the fifth electrode and the sixth electrode and sequentially arranged in a direction approaching the sixth electrode, and wherein the third electrode, the fifth electrode and the first electrode are in a same layer; the fourth electrode, the sixth electrode and the second electrode are in a same layer; the second hole transport layer, the third hole transport layer and the first hole transport layer are in a same layer; the second electron transport layer, the third electron transport layer and the first electron transport layer are in a same layer; and the second hole blocking layer and the third hole blocking layer each are in a same layer with the at least one first hole blocking layer in a one-to-one correspondence.

9. The display substrate according to claim 8, wherein a thickness of the green emission layer is greater than a thickness of the blue emission layer and less than a thickness of the red emission layer.

10. The display substrate according to claim 8, wherein a thickness of the third electron blocking layer is greater than a thickness of the first electron blocking layer and less than a thickness of the second electron blocking layer.

11. The display substrate according to claim 7, wherein the first electrode is between the blue emission layer and the base substrate, and the second electrode is on a side of the blue emission layer away from the base substrate.

12. A display apparatus, comprising the display substrate according to claim 7.

13. A method for manufacturing the organic light emitting diode according to claim 1, comprising:
- forming the first electrode;
- forming the first hole transport layer, the first electron blocking layer, the blue emission layer, the at least one first hole blocking layer, and the first electron transport layer, respectively, wherein the first hole transport layer, the first electron blocking layer, the first emission layer, the at least one first hole blocking layer, and the first electron transport layer are arranged in a direction leaving the first electrode; and a total thickness of all the at least one first hole blocking layer is greater than a thickness of the first electron blocking layer; and
- forming the second electrode, wherein the second electrode is arranged opposite to the first electrode.

14. The method according to claim 13, wherein each of the at least one first hole blocking layer is formed by an evaporation process.

15. The organic light emitting diode according to claim 2, wherein the total thickness of all the at least one first hole blocking layer is 1.5 or more times the thickness of the first electron blocking layer.

16. The organic light emitting diode according to claim 2, wherein a thickness of each of the at least one first hole blocking layer is in a range of 2 nm to 10 nm.

17. The organic light emitting diode according to claim 3, wherein the total thickness of all the at least one first hole blocking layer is 1.5 or more times the thickness of the first electron blocking layer.

* * * * *